(12) United States Patent
Dong et al.

(10) Patent No.: US 9,378,793 B2
(45) Date of Patent: Jun. 28, 2016

(54) INTEGRATED MRAM MODULE (71) Applicant: QUALCOMM Incorporated, San Diego, CA (US)

(72) Inventors: Xiangyu Dong, La Jolla, CA (US); Jung Pill Kim, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 396 days.

(21) Appl. No.: 13/721,092

(22) Filed: Dec. 20, 2012

(65) Prior Publication Data

US 2014/0177325 A1 Jun. 26, 2014

(51) Int. Cl.
G11C 11/00 (2006.01)
G11C 11/16 (2006.01)

(52) U.S. Cl.
CPC ........ *G11C 11/16* (2013.01); *G11C 2211/5643* (2013.01); *Y10T 29/49117* (2015.01)

(58) Field of Classification Search
None
See application file for complete search history.

(56) References Cited

U.S. PATENT DOCUMENTS

| | | | | |
|---|---|---|---|---|
| 5,702,984 | A * | 12/1997 | Bertin | G11C 5/04 257/686 |
| 6,289,420 | B1 * | 9/2001 | Cypher | 711/144 |
| 7,023,726 | B1 | 4/2006 | Chen et al. | |
| 8,065,472 | B2 | 11/2011 | Manus et al. | |
| 2004/0193782 | A1 | 9/2004 | Bordui | |
| 2005/0177679 | A1 | 8/2005 | Alva et al. | |
| 2007/0290315 | A1 * | 12/2007 | Emma | H01L 25/0652 257/686 |
| 2008/0133864 | A1 | 6/2008 | Hinkle et al. | |
| 2012/0137055 | A1 | 5/2012 | Lee et al. | |
| 2012/0155160 | A1 | 6/2012 | Alam et al. | |
| 2013/0073812 | A1 * | 3/2013 | Kanai et al. | 711/141 |
| 2013/0108889 | A1 * | 5/2013 | Piramanayagam | G11B 5/3909 428/811.2 |
| 2013/0346695 | A1 * | 12/2013 | Loh | G06F 12/0897 711/122 |

FOREIGN PATENT DOCUMENTS

| | | |
|---|---|---|
| EP | 1739748 A2 | 1/2007 |
| JP | 2006338513 A | 12/2006 |
| WO | 2004090725 A2 | 10/2004 |

OTHER PUBLICATIONS

Chang et. al., "Engergy-Efficient Cached DIMM Architecture", 2012 IEEE 20th International Symposium on Modeling, Analysis, and Simulation of Computer and Telecommunications Systems, pp. 501-503.*
International Search Report and Written Opinion—PCT/US2013/076994—ISA/EPO—Apr. 14, 2014.

* cited by examiner

*Primary Examiner* — Kretelia Graham
(74) *Attorney, Agent, or Firm* — Donald D. Min; Paul Holdaway (57) ABSTRACT

Systems and methods for integrated magnetoresistive random access memory (MRAM) modules. An integrated circuit includes a processor without a last level cache integrated on a first chip a MRAM module comprising a MRAM last level cache and a MRAM main memory integrated on a second chip, wherein the MRAM module is a unified structure fabricated as monolithic package or a plurality of packages. The second package further includes memory controller logic. A simplified interface structure is configured to couple the first and the second package. The MRAM module is designed for high speed, high data retention, aggressive prefetching between the MRAM last level cache and the MRAM main memory, improved page handling, and improved seal ability.

15 Claims, 6 Drawing Sheets

CONVENTIONAL
FIG. 1

INTEGRATED MRAM MODULE

FIELD OF DISCLOSURE

Disclosed embodiments are directed to magnetoresistive random access memory (MRAM). More particularly, exemplary embodiments are directed to integrated MRAM modules comprising memory elements such as MRAM last-level cache, MRAM main memory, and memory controller.

BACKGROUND

Performance and energy efficiency of processing systems can be improved with efficient designs for memory subsystems. Conventional architectures for memory subsystems include a combination of non-volatile memory, such as static random access memory (SRAM), and volatile memory, such as dynamic random access memory (DRAM). SRAM and DRAM technologies are well known in the art.

SRAM cells are usually faster, but also larger than DRAM cells. Despite their expensive area consumption, SRAMs find a place on-chip in register files and caches, because of their higher speed and performance characteristics. However, SRAM cells tend to be leaky in nature and with shrinking device technology, the leakage problem of SRAM cells is exacerbated.

DRAM cells on the other hand, offer the advantages of small size or high density, at the cost of lower speeds. DRAM is conventionally used in main memory which can be located off-chip. DRAM is also lower cost, and can lend itself well to stacked architectures for creating large low-cost off-chip storage solutions. However, DRAM also suffers from limited scalability with shrinking device technology, especially in sub 10 nm range. Another well recognized disadvantage of DRAMs is their volatile nature, which requires constant refreshing, and thus incurring undesirable costs associated with refresh power.

Accordingly, conventional memory subsystem designs which employ performance-oriented SRAMs for on-chip caches and density-oriented DRAMs for off-chip memory suffer from limitations. Recent trends in processing system designs are placing high demands on on-chip last-level cache (LLC). Thus, SRAM LLCs are tending to occupy large areas on-chip, where the available real estate is constantly shrinking with ever-increasing components and shrinking overall surface area. On the other hand, applications with higher data access requirements are also placing additional stress on off-chip DRAM employed in main memory. However, DRAM is not well suited for delivering such higher bandwidth, as discussed above. Furthermore, off-chip interconnects between on-chip processors and off-chip memory, are also stressed more severely to meet increasing demands on bandwidth and this is also leads to increased power consumption.

Accordingly, there is a need in the art for memory subsystem designs which overcome the aforementioned problems associated with conventional designs.

SUMMARY

Exemplary embodiments of the invention are directed to systems and method for integrated MRAM modules comprising memory elements such as MRAM last-level cache and MRAM main memory.

For example, an exemplary embodiment is directed to an integrated circuit comprising: a processor; a magnetoresistive random access memory (MRAM) module comprising a MRAM last level cache and a MRAM main memory, and an interface coupling the processor and the MRAM module.

Another exemplary embodiment is directed to a method of forming an integrated circuit, the method comprising: forming a processing chip without a last level cache on a first package, and forming a MRAM module comprising a MRAM last level cache and a MRAM main memory in a second package.

Another exemplary embodiment is directed to a system comprising: a processing means without a last level cache formed on a first package, and a magnetoresistive random access memory (MRAM) memory means comprising a last level cache and a main memory formed in a second package.

Yet another exemplary embodiment is directed to a method of forming an integrated circuit, the method comprising: step for forming a processing chip without a last level cache on a first package, and step for forming a MRAM module comprising a MRAM last level cache and a MRAM main memory in a second package.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary embodiments recognize the problems associated with conventional memory architectures comprising on-chip caches designed with SRAMs, off-chip memory designed with DRAMs with expensive and power hungry interconnects between on-chip processing components and off-chip memory. Embodiments alleviate these problems with exemplary Magnetoresistive Random Access Memory (MRAM) modules which will be described in further detail herein.

MRAM is a non-volatile memory technology, which features high speed as well as small size and low cost. In contrast to conventional RAM technologies such as SRAM and DRAM, which store data as electric charges or current flows, MRAM uses magnetic elements. In MRAM, a magnetic tunnel junction (MTJ) storage element can be formed from two magnetic layers, each of which can hold a magnetic field, separated by a tunnel barrier layer, or the like. One of the two magnetic layers, commonly referred to as "fixed layer", is set to a particular polarity. The polarity of the other magnetic layer, commonly referred to as "free layer" is free to change to match that of an external field that can be applied. A change in the polarity of the free layer will change the resistance of the NM storage element. Accordingly, when the polarities of the two magnetic layers are aligned, a low resistance state exists, which can be designated as a first logic state, such as logic "0". When the polarities are not aligned, a high resistance state exists, which can be designated as a second logic state, such as logic "1", In this manner, MRAM can binary data based on relative polarities of the two magnetic layers. For a read operation, current can be passed through the MTJ storage element and the electrical resistance can be measured to determine if the value stored is a "0" or a "1". For a write operation, data can be written by propagating a current to establish the magnetic fields. One of ordinary skill in the art will understand further implementation and variations that are associated with MRAM.

It is seen that MRAM has several desirable characteristics that make it a candidate for a universal memory. The desirable characteristics include high speed, high density or small bitcell size, low power consumption, and no degradation over time. Variations of conventional MRAM may further improve on such desirable aspects. For example, spin transfer torque MRAM (STT-MRAM) uses electrons that become spin-polarized as the electrons pass through a thin film which functions as a spin filter. STT-MRAMs are seen to be more scalable than conventional MRAM and may also feature simpler circuit designs. STT-MRAM is also known as Spin Transfer Torque RAM (STT-RAM), Spin Torque Transfer Magnetization Switching RAM (Spin-RAM), and Spin Momentum Transfer (SMTRAM).

Exemplary embodiments will be described with reference to MRAM. However, it will be understood that this description is illustrative and not intended as a limitation. Accordingly, it will be understood that embodiments may be extended to any suitable variation of MRAM technology, such as STT-MRAM without departing from the scope of this disclosure.

Moreover, it will be understood that the terms "integrated circuit," "chip," "package," "die," etc may be used interchangeably with reference to embodiments. A reference to a component "on-chip" may indicate that the component is integrated on the same chip as a processor, application processor (AP), processing core, etc., which do not include main memory, Correspondingly, an "off-chip" component may refer to a component which is not integrated on-chip. A reference to a "package" can generally indicate one or more semiconductor dies which may be packaged together using system-in-package (SiP), three-dimensional (3D) through-silicon-via (TSV), and/or other technologies. References to "monolithic" packages or dies may be used to convey integration or fabrication of components as a unified block, on a chip, die, or package.

Figure 1:
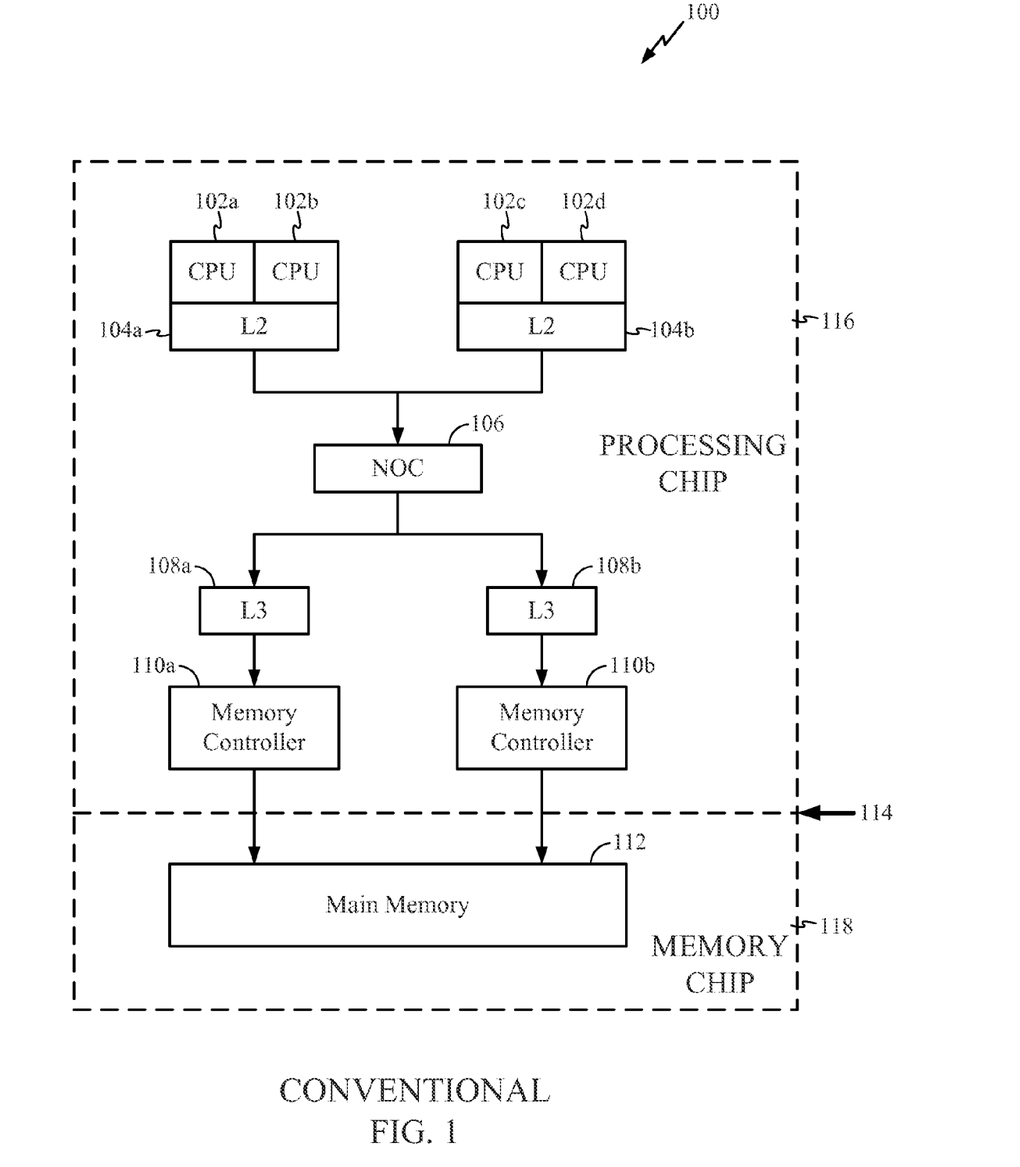
FIG. 1 illustrates an integrated circuit comprising conventional processing system 100.

With reference now to FIG. 1 an integrated circuit comprising conventional processing system 100 is illustrated. As shown, processing system 100 may include processing chip 116 on which processing elements may be integrated and memory chip 118 which may be dedicated to memory. More specifically, application processor (AP) or processing chip 116 may include on-chip elements, such as one or more processors or central processing units (CPU) 102a-d, one or more shared second level or L2 caches 104a-b, a network such as a network-on-chip (NoC) 106 comprising interconnects coupling L2 caches 104a-b to one or more third/last level or L3 caches 108a-b (which may be designed from non-volatile memory such as SRAM). L3 caches 108a-b can be coupled to one or more memory controllers 110a-b as shown. The operation of these on-chip elements in processing chip 116 is well known in the art, and for the sake of brevity, a detailed explanation of their architecture and operation will not be undertaken here. Processing chip 116 may interface with main memory 112 (which may be formed from volatile memory such as DRAM). Main memory 112 may be integrated on memory chip 118. Accordingly, main memory 112 is off-chip, or in other words, integrated on a chip or die that is different from processing chip 116. Interface 114 comprises interconnects and other components to interface processing chip 116 with memory chip 118. Conventional processing system 100 suffers from the aforementioned drawbacks of utilizing SRAM and DRAM technologies, as well as the limitations of interfaces such as interface 114. Exemplary embodiments which overcome these drawbacks and limitations of conventional processing system 100 will now be described.

Figure 2:
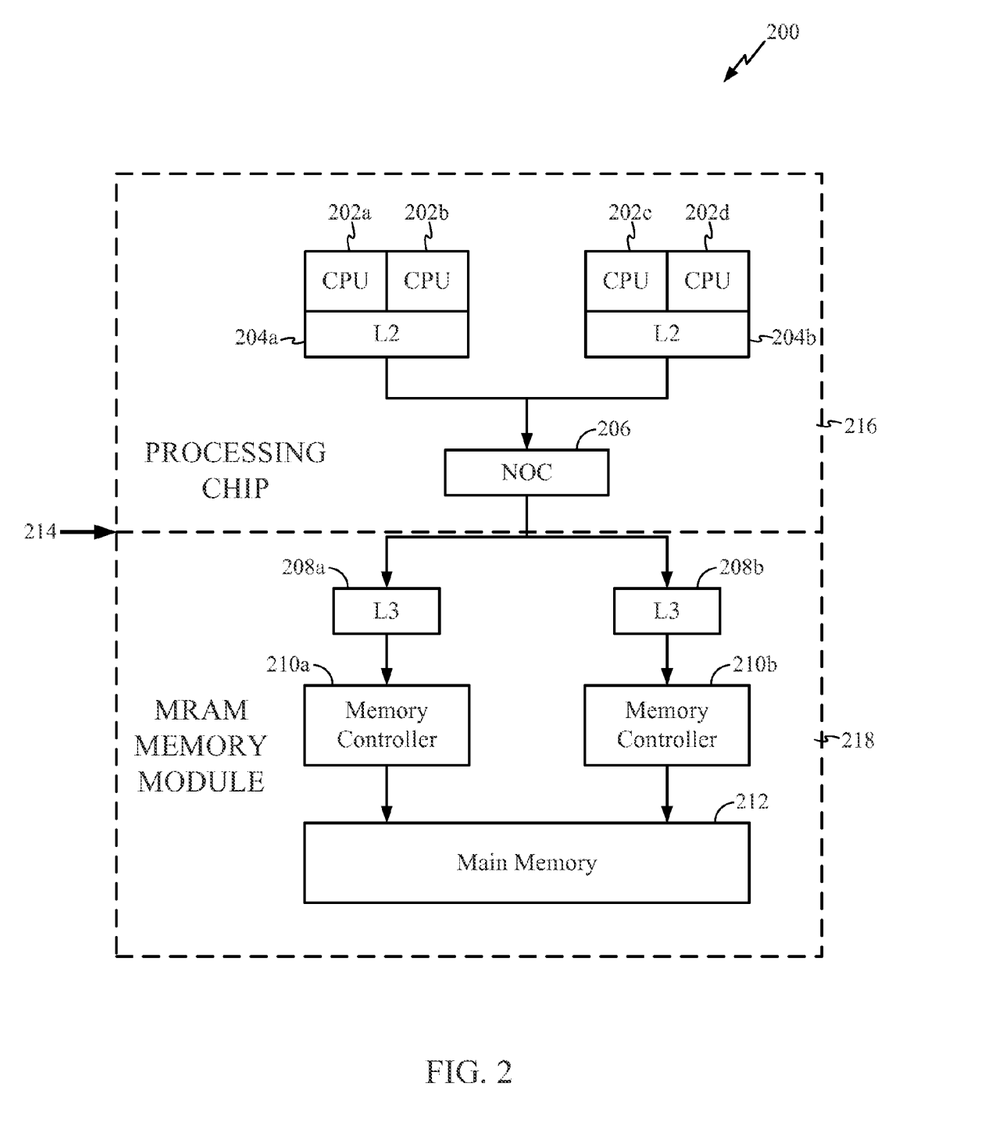
FIG. 2 illustrates an integrated circuit comprising exemplary processing system 200 and memory module 218 configured according to exemplary embodiments.

With reference to FIG. 2, an integrated circuit comprising exemplary processing system 200 is illustrated. Exemplary processing system 200 differs from conventional processing system 100 in several ways. For example, exemplary processing system 200 redefines interface 214 between processing chip 216 and memory module 218. Exemplary processing system 200 is also directed to memory module 218 comprised entirely of the same or similar memory cells. For example, in one embodiment, memory module 218 may be formed entirely of MRAM cells. Further, memory module 218 may be fabricated as a monolithic die or a monolithic package, wherein a package can comprise a single die or multiple dies coupled together using advanced packaging technologies such as SiP and/or 3D TSV. More particularly, memory module 218 may comprise one or more last level or L3 caches 208a-b, one or more memory controllers 210a-b, and main memory 212 formed as a unified block, and wherein all the memory cells of L3 caches 208a-b and main memory 212 are MRAM cells. In other words, the SRAM cells used in conventional L3 caches 108a-b and the DRAM cells used in conventional main memory 112 are all replaced by MRAM cells in memory module 21$. Once again, operational details of the various above-mentioned functional and memory elements of exemplary processing system 200 will be omitted here as skilled persons will be able to design exemplary processing system 200 according to particular need without departing from the scope of the exemplary embodiments.

Further aspects of exemplary processing system 200 will now be described. In one related aspect, it will be seen that in comparison to interface 114 of conventional processing system 100, the complexity of exemplary interface 214 can be significantly reduced. For example, interface 214 can be simplified to only include interconnects and components related to network NoC 206 configured to interface L2 caches 204a-b with L3 caches 208a-b, in contrast to the complex interface 114 required to interface processing chip 116 with memory chip 118.

In another related aspect, in contrast to conventional techniques, exemplary implementations can support increased flexibility, for example with regard to expansion of LLCs. In an example, it can be seen that additional LLCs such as a 16 MB L3 cache can be integrated in memory module 218 which comprises a 4 GB main memory 212, with only a marginal increase in terms of area and hardware. Thus, flexibility in memory architecture and design can be achieved, to suit particular needs. On the other hand, conventional implementations cannot offer similar flexibility. For example, a similar addition of a 16 MB L3 cache in processing chip 112 will incur a significant explosion of die area, because the size of a die on which processing chip 116 is integrated will be largely tailored to the size of on-chip memory elements such as L2 caches 104a-b and L3 caches 110a-b. Accordingly, addition of a 16 MB LLC cannot be achieved with the same ease on conventional processor chip 116 because such addition, if at all possible, would require a significant redesign of processor chip 116, whereas such addition would merely entail a marginal increase in area which can be easily absorbed into an existing die in the case of exemplary memory 218. Further detailed implementation and advantageous aspects of exemplary processing systems with MRAM based memory modules (hereafter "MRAM module") will now be provided.

Figure 3:
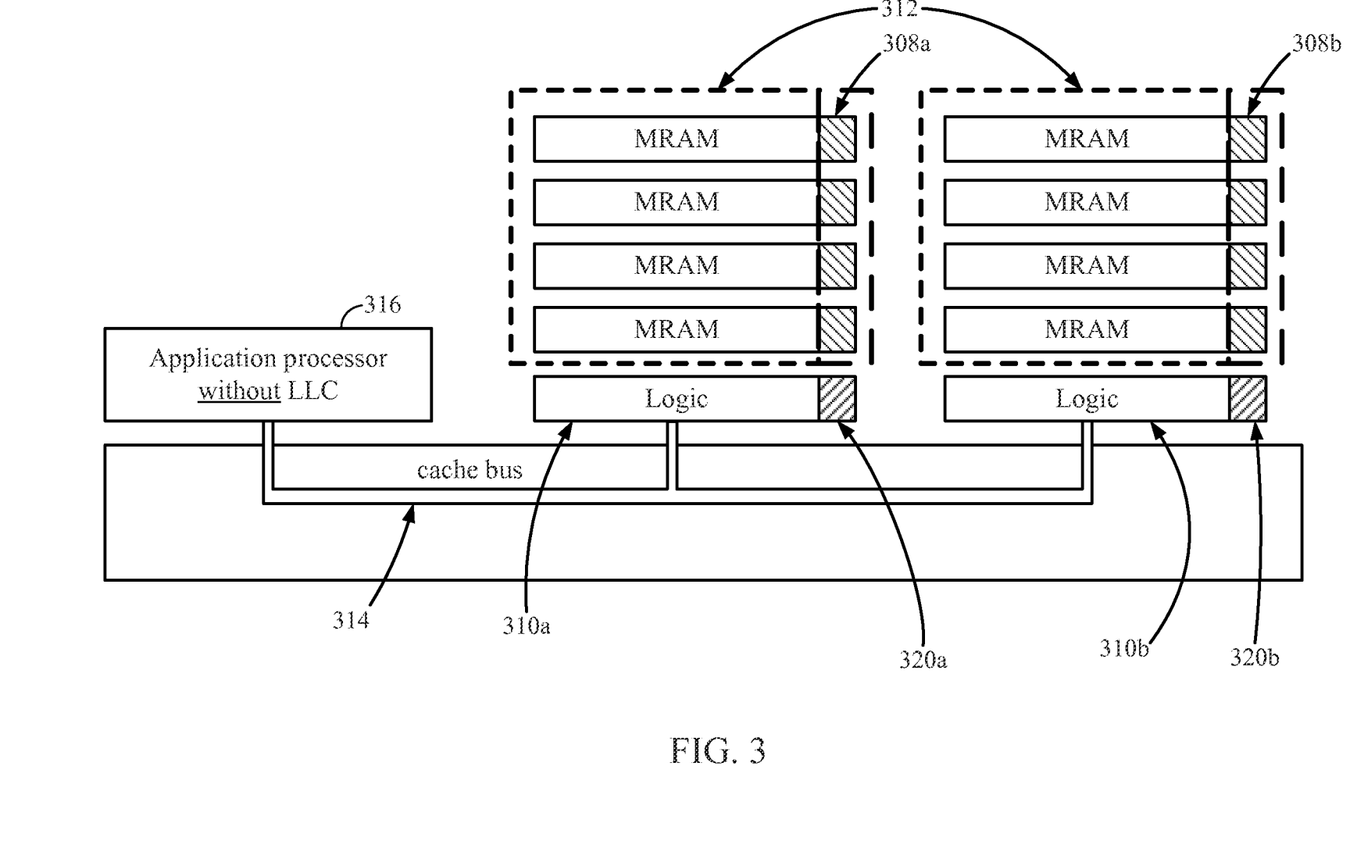
FIG. 3 is a schematic illustration of exemplary processing system 300 comprising exemplary MRAM module 318.

With reference now to FIG. 3, there is shown a schematic illustration of exemplary processing system 300. As shown, application processor (AP) can be fabricated on a first die or package, processing chip 316, which can include processing elements and on-chip caches, but exclude a last level cache (LLC). Interconnect or cache bus 314 may couple AP 316 to MRAM module 318. In the illustrated embodiment, an efficient integration of the components of MRAM module 318 can be achieved. As shown, main memory comprising MRAM arrays 312 may be formed in a stacked configuration comprising two or more main memory stacks. One or more MRAM LLCs 308a-b can be likewise divided into two or more LLC stacks and formed as extensions of Me main memory stacks. Logic blocks 310a-b can comprise memory controllers and access logic to access MRAM main memory 312. Additional cache control logic 320a-b may also be included for accessing MRAM L3 caches 308a-b.

Accordingly, aspects of MRAM module 318 in exemplary processing system 300 can be directed to simplified fabrication of MRAM module 318 by designing LLCs with incremental fabrication processes and resources overlaid on main memory design. Additional aspects of this embodiment can relate to handling memory page operations entirely inside MRAM module 318 because last level caches and main memory, which are conventionally utilized for memory page operations, are both present inside the unified structure of MRAM module 318 with integrated logic 310a-b and 320a-b. The particularly illustrated stacked structure in FIG. 3 can also facilitate aggressive prefetching between MRAM LLCs 308a-b and MRAM main memory 312. Moreover, memory buses or other communication infrastructure between MRAM LLCs 308a-b and MRAM main memory 312 need not comply with JEDEC standards, and a designer may choose non-JEDEC implementations. It can also be seen that both, based on the scalable nature of MRAM cells themselves, as well as, the exemplary architecture of MRAM module 318, embodiments advantageously lend themselves to improved scalability, in comparison to conventional processing system 100.

Figure 4A:
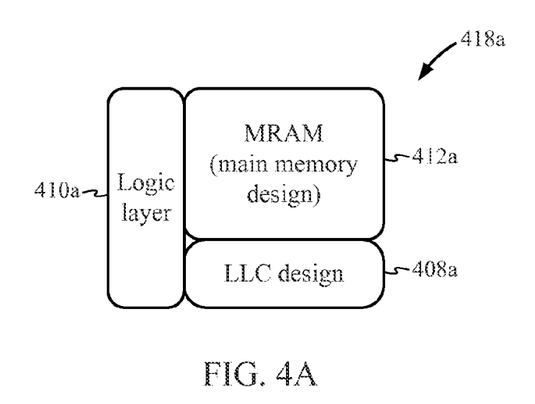
FIGS. 4A-C illustrate physical implementations of exemplary MRAM modules.
Figure 4B:
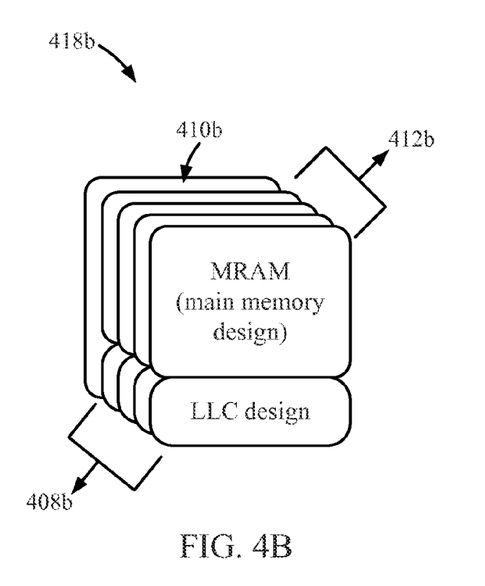
Figure 4C:
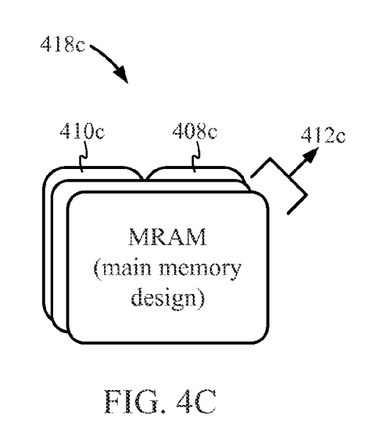

Referring to FIGS. 4A-C, physical implementations of exemplary MRAM modules are schematically illustrated. As shown in FIG. 4A, MRAM module 418a can be implemented as a two-dimensional (2D) design. Logic layer 410a (which may include both memory controller logic as well as cache controller logic) and MRAM LLC 408a can be laid out along outer edges of MRAM main memory 418a formed in a center portion.

FIG. 4B illustrates an alternative physical implementation for MRAM module 418b as a three-dimensional (3D) homogenous architecture. Logic layer 410b may be designed on a logic layer plane and one or more layers of MRAM main memory 412b may be formed on main memory planes parallel to the logic layer plane. MRAM LLCs 408b may be formed alongside each layer of MRAM main memory 412b on the same planes as MRAM main memory 412b, for ease of fabrication and design.

FIG. 4C illustrates yet another physical implementation for MRAM module 418c as a 3D heterogeneous architecture. Logic layer 410c and MRAM LLCs 408c may be designed on a heterogenous plane and one or more layers of MRAM main memory 412b may be formed on main memory planes parallel to the heterogenous plane. In this architecture, logic layer 410c and MRAM LLCs 408c may be tacked on or added to existing MRAM main memory block 412b in order to form MRAM module 418c.

Accordingly, based on particular design needs, a designer may choose a suitable implementation from various physical implementations which may include, but not be limited to, structures such as MRAM modules 418a-c. Moreover, as previously noted, embodiments may be extended to other memory cell technologies, such as STT-MRAM, without departing from the scope of the above-described embodiments.

Accordingly, it is seen that exemplary embodiments can overcome drawbacks of conventional processing systems by redefining the boundary between processing elements and memory cells, and forming a unified memory module with improved interface with processing elements. The unified memory module may include LLCs, memory controller and cache controller logic, and main memory, wherein the LLCs and main memory may be formed from MRAM or STT- MRAM, thus overcoming problems associated with conventional SRAM/DRAM combinations for LLCs and main memory.

Figure 5:
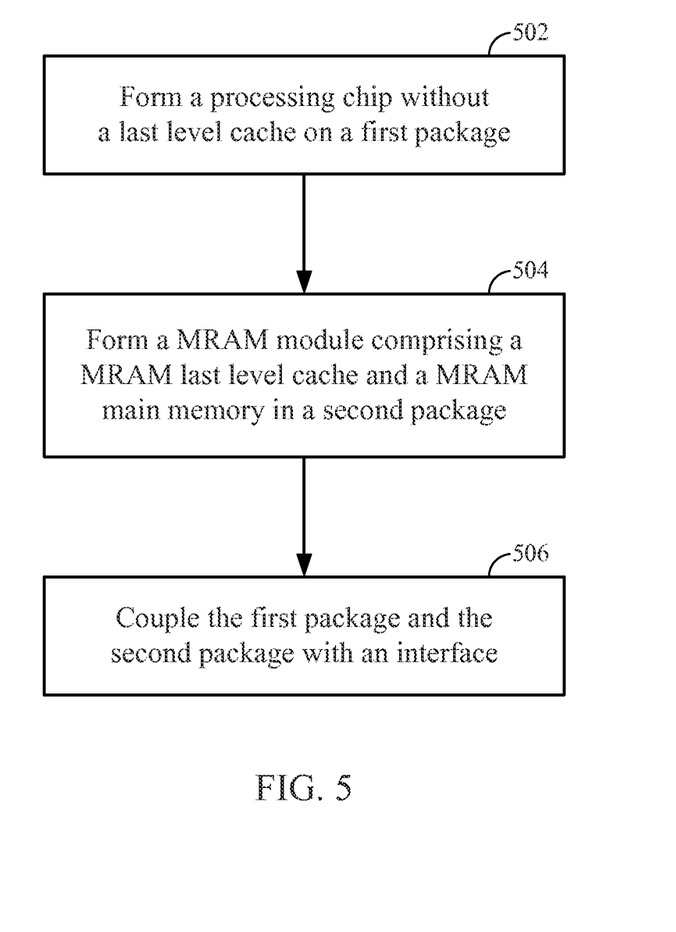
FIG. 5 illustrates a flow diagram for a method of forming an integrated circuit comprising a processor and MRAM module according to exemplary embodiments.

It will be appreciated that embodiments include various methods for performing the processes, functions and/or algorithms disclosed herein. For example, as illustrated in FIG. 5, an embodiment can include a method of forming an integrated circuit (e.g. exemplary processing system 200), the method comprising: forming a processing chip without a last level cache on a first package Block 502; and forming an MRAM module comprising a MRAM last level cache and a MRAM main memory in a second package—Block 504. Some embodiments can further include coupling the first package and the second package with an interface Block 506. Additionally, embodiments can also include forming memory controller and cache controller logic in the second package.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming a MRAM module comprising a MRAM last level cache and a MRAM main memory, the MRAM module fabricated as a monolithic package. Accordingly, the invention is not limited to illustrated examples and any means for performing the functionality described herein are included in embodiments of the invention.

Figure 6:
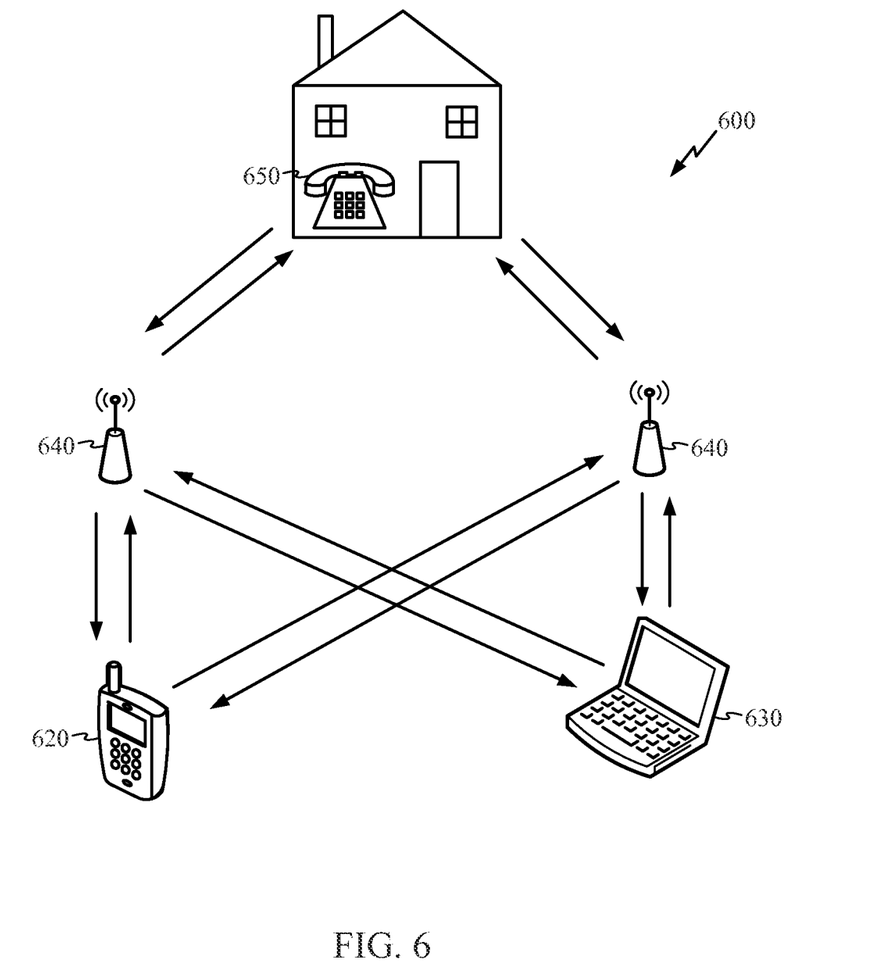
FIG. 6 illustrates an exemplary wireless communication system 600 in which an embodiment of the disclosure may be advantageously employed.

FIG. 6 illustrates an exemplary wireless communication system 600 in which an embodiment of the disclosure may be advantageously employed. For purposes of illustration, FIG. 6 shows three remote units 620, 630, and 650 and two base stations 640. In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, settop boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An integrated circuit comprising:
a processor;
a magnetoresistive random access memory (MRAM) module comprising a MRAM last level cache and a MRAM main memory, wherein the MRAM main memory is divided into two or more main memory stacks, and wherein the MRAM last level cache is divided into two or more last level cache stacks, and wherein the two or more last level cache stacks are formed as extensions of the two or more main memory stacks; and
an interface to couple the processor and the MRAM module.

2. The integrated circuit of claim 1, the processor is integrated on a first chip, and the MRAM module is integrated in a second chip, and the interface is located on a boundary between the first chip and the second chip.

3. The integrated circuit of claim 1, wherein the MRAM module further comprises memory controller logic.

4. The integrated circuit of claim 1, wherein the MRAM module is fabricated as a monolithic package.

5. The integrated circuit of claim 1, wherein the MRAM module is fabricated as a plurality of packages.

6. The integrated circuit of claim 1, wherein the MRAM last level cache and the MRAM main memory comprise Spin Transfer Torque MRAM (STT-MRAM) bit cells.

7. The integrated circuit of claim 1, wherein the MRAM module is formed as a two-dimensional (2D) architecture comprising the MRAM main memory in a center portion, and the MRAM last level cache formed in a first outer edge of the MRAM main memory.

8. The integrated circuit of claim 7, further comprising a logic layer formed in a second outer edge of the MRAM main memory.

9. The integrated circuit of claim 1, wherein the MRAM module is formed as a three-dimensional (3D) homogenous architecture comprising the MRAM main memory formed on one or more main memory planes, and the MRAM last level cache is integrated on the one or more main memory planes.

10. The integrated circuit of claim 9, further comprising a logic layer formed in a logic layer plane parallel to the one or more main memory planes.

11. The integrated circuit of claim 1, wherein the MRAM module is formed as a three-dimensional (3D) heterogeneous architecture comprising the MRAM main memory formed on one or more main memory planes, and the MRAM last level cache and a logic layer are integrated on a heterogeneous plane parallel to the or more main memory planes.

12. The integrated circuit of claim 1, integrated into a device, selected from the group consisting of a set top box, music player, video player, entertainment unit, navigation device, communications device, personal data assistant (PDA), fixed location data unit, and a computer.

13. A system comprising:
   a processing means without a last level cache formed on a first package; and
   a magnetoresistive random access memory (MRAM) memory means comprising a last level cache and a main memory formed in a second package, wherein the main memory is divided into two or more main memory stacks, and wherein the last level cache is divided into two or more last level cache stacks, and wherein the two or more last level cache stacks are formed as extensions of the two or more main memory stacks.

14. The system of claim 13, further comprising means for interfacing the first package and the second package.

15. The system of claim 13, wherein the second package further comprises memory controller means.

* * * * *